United States Patent
Choy

(10) Patent No.: US 6,626,518 B2
(45) Date of Patent: Sep. 30, 2003

(54) BENDING A TAB FLEX CIRCUIT VIA CANTILEVERED LEADS

(75) Inventor: Si-Lam Choy, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/003,876

(22) Filed: Oct. 25, 2001

(65) Prior Publication Data

US 2003/0081066 A1 May 1, 2003

(51) Int. Cl.[7] .................................................. B41J 2/05
(52) U.S. Cl. ........................................ 347/50; 347/58
(58) Field of Search ............................. 347/13, 42, 47, 347/50, 58

(56) References Cited

U.S. PATENT DOCUMENTS

| | | | |
|---|---|---|---|
| 5,442,386 A | * | 8/1995 | Childers et al. .............. 347/50 |
| 5,742,484 A | | 4/1998 | Gillette et al. |
| 5,831,788 A | | 11/1998 | Hofland |
| 5,883,759 A | | 3/1999 | Schulz ....................... 360/104 |
| 6,227,651 B1 | * | 5/2001 | Watts et al. .................. 347/50 |
| 6,402,299 B1 | * | 6/2002 | DeMeerleer et al. .......... 347/50 |

FOREIGN PATENT DOCUMENTS

EP 562308 A2 9/1993

* cited by examiner

Primary Examiner—Anh T. N. Vo

(57) ABSTRACT

A method of manufacturing an electronic device is provided comprising steps of providing a circuit having at least one cantilever lead, providing a die having at least one bonding region, bonding the at least one cantilever lead to the at least one bonding region, and bending the at least one bonded cantilever lead. Preferably, the electronic device comprises an inkjet cartridge.

17 Claims, 3 Drawing Sheets

BENDING A TAB FLEX CIRCUIT VIA CANTILEVERED LEADS

BACKGROUND OF THE INVENTION

Field of the Invention

The invention relates generally to a method of electrically interconnecting electronic devices, more particularly, to a method of manufacturing an inkjet cartridge comprising a flex circuit having at least one cantilever lead and a printhead.

BACKGROUND OF THE INVENTION

Electronic devices are used in a variety of common products. Typically, electronic devices are connected via wires and/or circuit traces. Many devices, however, such as inkjet cartridges, are sensitive to cost and have tight tolerance restrictions between components, necessitating a more advanced method of connecting and manufacturing electronic devices.

A typical inkjet cartridge has an electronic circuit wrapped onto two sides of a cartridge. The circuit connects the printhead on one (bottom) side of the cartridge to the rest of the printing device on an orthogonal side. To reduce the cost of the inkjet cartridge, it is desirable to reduce the size of this circuit. Typically the printhead is connected to the circuit on two sides of the printhead. One method to reduce the size of the circuit is to only connect to one end of the printhead, on the side closest to where the circuit wraps to the orthogonal side of the cartridge. The circuit need not span the length of the printhead or beyond in order to connect to the printhead.

One method to electrically connect to the inkjet printhead is known as wirebonding. The electronic circuit has a first plurality of bonding regions which are connected to a second plurality of bonding regions on the printhead via wires. Typically, the printhead and electronic circuit are positioned on a cartridge prior to wirebonding the two bonding regions.

Wirebond manufacturing of inkjet cartridges requires a flat bonding region on the circuit for proper adhesion. A bottom of form requirement in conventional printers requires the flat bonding region on the circuit to be in close proximity of where the circuit wraps to the orthogonal side of the cartridge. Bottom of form requirements are primarily determined by the position of a pinch roller and drive roller that drives the paper in relation to the inkjet nozzles on the printhead. A tight wrap of the electronic circuit (e.g. 0.5 mm radius) is required to meet bottom of form requirements.

The tight wrap causes great stresses in the circuit in the bonding region, so greater adhesion of the circuit to the cartridge is required to keep the bonding region flat. However, due to the reduction in the size of the electronic circuit on the printhead side of the cartridge, the area and leverage for adhesion of the circuit to the cartridge is much smaller than typical. Consequently the bonding region of the circuit is not flat and resultant stresses propagate to the encapsulant used to protect the wires.

Another such method of manufacturing an inkjet cartridge, known as tape automated bonding (TAB), also connects an electronic circuit to a printhead. The electronic circuit includes a plurality of leads which are bonded to a plurality of bonding regions on the printhead. Typically, both the printhead and electronic circuit are bonded together prior to being positioned onto the inkjet cartridge.

Similar to the wirebonding method, the TAB method includes a tight wrap required to meet bottom of form requirements, causing considerable stresses in the circuit near the plurality of leads. Greater adhesion of the circuit to the cartridge is required to counter the increased tendency of the circuit to detach from the cartridge due to the added stresses, yet the available area and leverage for adhesion is much smaller than typical. Inadequate adhesion leads to resultant stresses in the bonds between the plurality of leads and the bond pads on the printhead, causing failure of the bonds. These stresses also propagate to the encapsulant protecting the plurality of leads and bonds to the printhead, reducing its reliability.

Typically, the electronic circuit cannot be pre-formed with the proper bent region (e.g. prior to bonding), because the electronic circuit has to conform as close as possible to the cartridge periphery, which varies on a per part basis. For wirebonding, this variation harms the flatness of the circuit in the bonding region. For TAB, this variation harms the critical alignment of the printhead to the inkjet cartridge.

Hence, a need exists for a method of electrically interconnecting electronic circuits and manufacturing inkjet cartridges that permits a substantial reduction in the size of the circuit on the printhead side of the cartridge, meets tight manufacturing tolerances, and/or prevents resultant stresses in the electronic circuit.

SUMMARY OF THE INVENTION

The present invention is directed to overcoming or at least reducing the effects of one or more of the problems set forth above and other problems in the prior art.

According to one aspect of the present invention, a method of manufacturing an electronic device is provided comprising the steps of providing a circuit having at least one cantilever lead, providing a die having at least one bonding region, bonding the at least one cantilever lead to the at least one bonding region, and bending the at least one bonded cantilever lead. In a preferred embodiment, the at least one cantilever lead comprises a first material having a greater ductility than a second material of the circuit. More preferably, the first material comprises copper.

According to another aspect of the present invention, the method of manufacturing an electronic device further comprises a step of shrouding the circuit having at least one bent cantilever lead.

According to another aspect of the present invention, the method of manufacturing an electronic device further comprises a step of encapsulating the at least one cantilever lead.

According to another aspect of the present invention, the method of manufacturing an electronic device further comprises a step of preventing the at least one bent cantilever lead from contacting the die in a non-bonding region.

According to another aspect of the present invention, an electronic printing device is provided comprising a die, a cartridge, and a circuit positioned adjacent to the cartridge, the circuit having at least one cantilever lead bonded to the die. The at least one cantilever lead is bent to the die. Preferably, the electronic printing device is an inkjet cartridge.

According to another aspect of the present invention, the at least one cantilever lead comprises a first material having a greater ductility than a second material of the circuit. Preferably, the first material comprises copper. More preferably, the second material comprises a flexible film.

According to another aspect of the present invention, the printing device further comprises a capping shroud positioned over the circuit, the capping shroud providing a continuous capping surface around the printhead.

According to another aspect of the present invention, the printing device further comprises an encapsulant dispensed over the at least one cantilever lead.

According to another aspect of the present invention, the die comprises a hedgerow, the hedgerow preventing the at least one cantilever lead from contacting the surface or corner of the die.

According to another aspect of the present invention, the die comprises a printhead.

According to another aspect of the present invention, the circuit comprises a flex circuit.

According to another aspect of the present invention, a method of attaching electronic devices is provided comprising the steps of positioning a first circuit having at least one protruding contact on a second circuit, attaching the at least one protruding contact to the second circuit, and applying a force to one of the first circuit and the second circuit, such that the at least one protruding contact is deformed by movement of one of the first and second circuits. Preferably, the first circuit comprises a flex circuit.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Reference will now be made in detail to presently preferred embodiments of the invention. Wherever possible, the same reference numbers will be used throughout the drawings to refer to the same or like parts.

Figure 1:
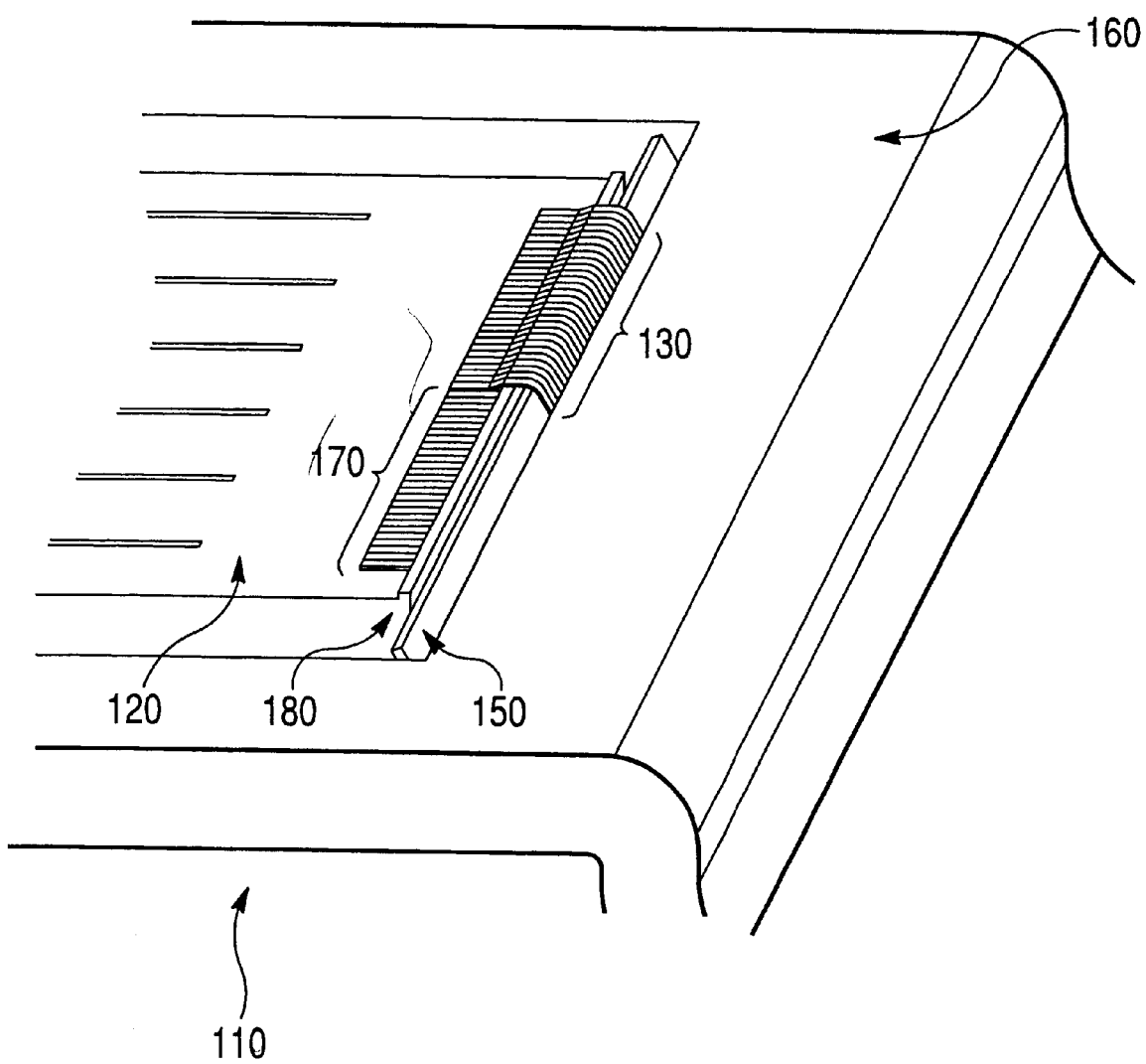
FIG. 1 is a block diagram of a first embodiment of an electronic device having at least one cantilever lead according to the present invention.
Figure 2:
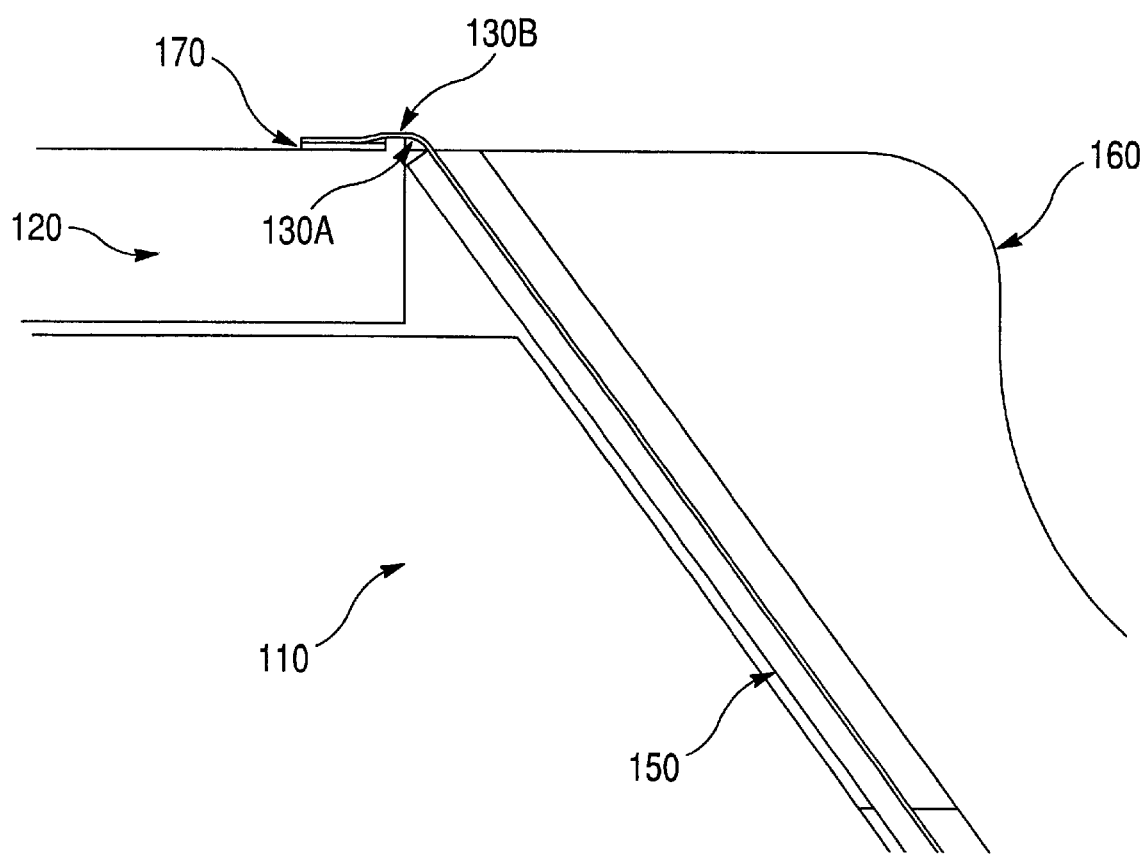
FIG. 2 is a block diagram of a side section view of the first embodiment of an electronic device having at least one cantilever lead according to the present invention.

A first embodiment of an inkjet cartridge according to the present invention is shown by the block diagram of FIG. 1 and FIG. 2. According to this first embodiment, the inkjet cartridge includes a flex circuit 150 having at least one cantilever lead 130 bonded to at least one bonding region 170 of a printhead die 120. The at least one bonding region 170, for example, may comprise a plurality of bonding pads or exposed conductive traces. Preferably, the printhead die 120 and flex circuit 150 are positioned on a cartridge 110. FIG. 1 and FIG. 2 show the cantilever leads already in a bonded position on the bonding region 170, with the at least one cantilever lead 130 bent so that the flex circuit 150 substantially conforms to a surface of the cartridge 110.

A capping shroud 160 is preferably positioned adjacent to the flex circuit 150 for protecting the flex circuit 150 and/or the at least one cantilever lead 130. The capping shroud 160 supports an elastomer cap in printers which requires a continuous surface around the printhead die 120 to properly seal in a humid environment for the printhead ink nozzles when the printing device is inactive. The capping shroud 160 further provides a physical protection of the printhead die 120 and the flex circuit 150 from printer wiper and corrosive inks. The capping shroud 160 may serve as an encapsulant dam, for application of an encapsulant around the at least one cantilever lead 130.

Encapsulant is preferably applied adjacent to the at least one cantilever lead 130 for protecting the at least one cantilever lead 130. As most clearly shown in FIG. 2, the encapsulant may be applied to an interior surface 130A of the at least one cantilever lead 130 on the same side as the cartridge 110, and/or to an exterior surface 130B of the at least one cantilever lead 130 on a side opposite the cartridge 110. One advantage of the present invention is that the encapsulant can be easily applied to the interior 130A surface of the at least one cantilever lead 130 after the printhead die 120 and the flex circuit 150 have been attached to the ink cartridge 110 but prior to the bending of the at least one cantilever lead 130. Encapsulant substantially seals off the at least one cantilever lead 130 from shorting out and/or oxidizing due to contact with corrosive ink or other chemicals, and thus preferably comprises a dielectric material. Encapsulant such as epoxies and epoxy novalacs have been found to provide such protection. Preferably, as best shown in FIG. 1, the printhead die 120 also includes a hedgerow 180, typically a non-conductive material applied to the surface of the printhead die 120, for preventing the at least one cantilever lead 130 from contacting the surface or corner of the printhead die 120 which could result in shorting out the at least one cantilever lead 130 with the printhead die 120 (typically made of a conductive material such as a semiconductor with conductive films on its surface).

According to this first embodiment, the flex circuit 150 comprises a first material surrounded by a second material. The at least one cantilever lead 130 may be formed by etching away the second material in a portion of the flex circuit 150, thereby exposing a plurality of cantilever leads 130 of the first material. Preferably, the first material comprises copper. Alternatively, the first material may comprise aluminum, nickel, gold, tantalum, chromium, and others as would be readily apparent to one skilled in the art. Most preferably, the at least one cantilever lead 130 comprises one ounce copper traces about thirty-six microns thick for improved stiffness of the at least one cantilever lead 130 to reduce bent leads in manufacturing prior to bonding. Alternatively, a thirty-six to seventy-five micron wide, one ounce copper lead length of five hundred microns may also be used. The actual size of the lead can vary in width, length, and thickness as the specific design warrants. Another common implementation is half-ounce copper (18 microns thick), approximately 500 microns long.

Preferably, the second material comprises a non-conductive flexible film. Flexible films such as polyimides, liquid crystal polymers, and poly-ethylene terephthalates may be used. Alternatively, the second material may comprise a rigid circuit board. As would be readily apparent to one skilled in the art, rigid circuit board materials can include FR-2, FR-4, or polyimide substrate.

By using a first material with a relatively high ductility for the at least one cantilever lead 130 in comparison to the second material, bending the at least one cantilever lead 130 does not result in substantial resultant stresses in the second material of the flex circuit 150. Consequently, an inkjet cartridge according to the present invention has the advantage of substantially reduced resultant stresses over conventional methods.

Preferably, the at least one bonding region 170 comprises a plurality of bonding pads. A gold plating may be applied to preferably copper bonding pads to facilitate thermocompression bonding of the at least one cantilever lead 130 to the bonding pads. The distance of the bonding pads to the edge of the printhead 120 and angle of the bend dictates the minimum length of the at least one cantilever lead 130.

Figure 3:
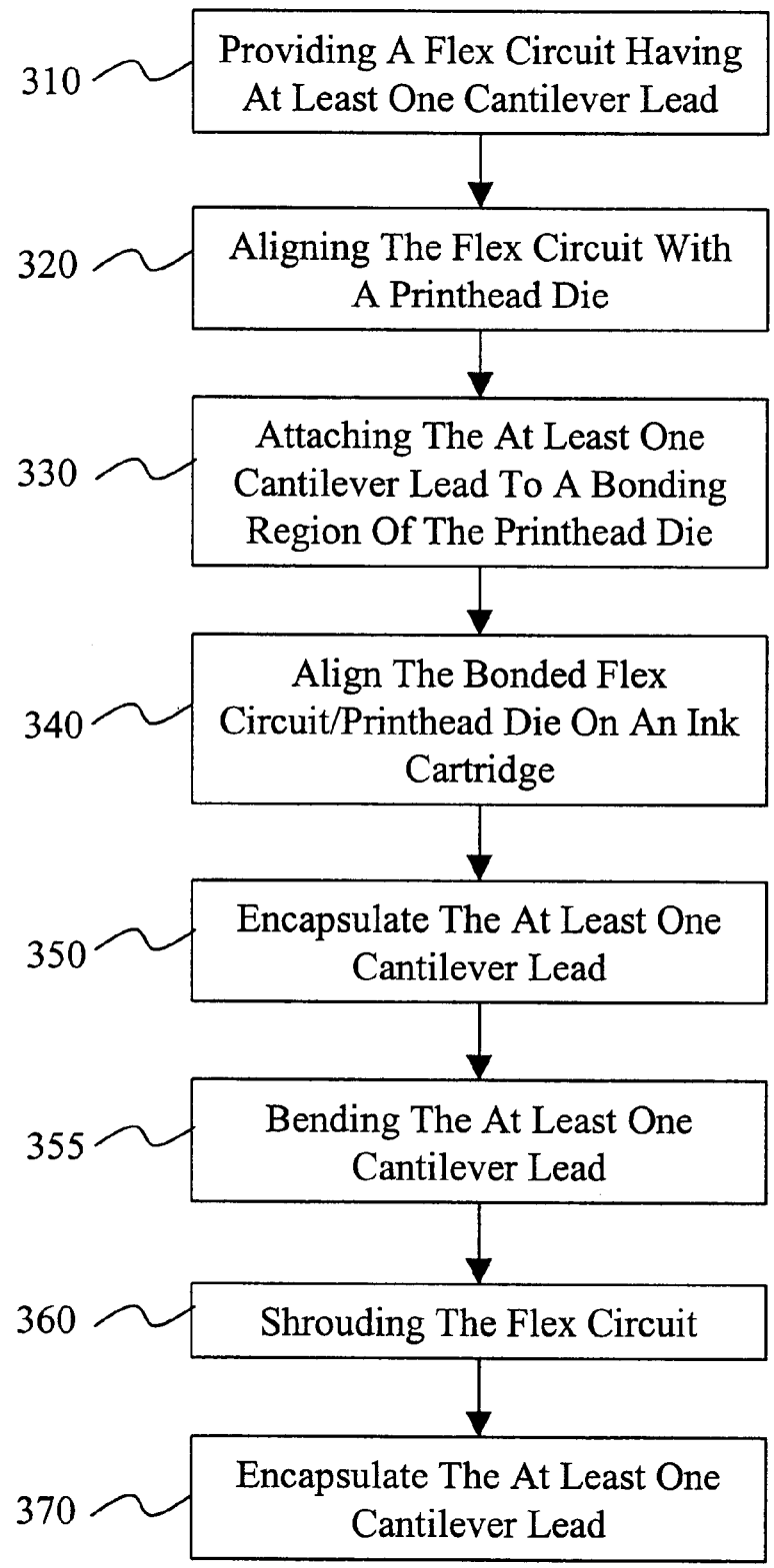
FIG. 3 is a block diagram of a first embodiment of a method of manufacturing an electronic device having at least one cantilever lead according to the present invention.

A first embodiment of a method of manufacturing an inkjet cartridge according to the present invention is shown by the block diagram of FIG. 3. According to this embodiment, a flex circuit having a plurality of cantilever leads is provided in step 310. The flex circuit having a plurality of cantilever leads is aligned with a printhead die in step 320. Step 320 may be performed, for example, by placing the flex circuit and printhead die in a conventional bonding tool. Preferably, the flex circuit and printhead die are aligned in on the same plane to facilitate a uniform and substantially flat bond between the flex circuit and printhead die. The plurality of cantilever leads are then attached to a bonding region of the printhead die in step 330 using standard bonding techniques. Step 330 may be performed, by way of example but not by way of limitation, by thermocompression (plated gold on copper lead to gold on bond pad). Further, step 330 may be performed by thermosonic, soldering, anisotropic conductive adhesion, conductive adhesion, press fitting, or any other electronic interconnecting method as would be readily apparent to one skilled in the art.

The bonded cantilever leads of the flex circuit/printhead die are positioned and aligned on an ink cartridge in step 340. Then the plurality of cantilever leads are bent in step 355 to substantially conform the flex circuit to a portion of the ink cartridge. The flex circuit and printhead die may be attached to the cartridge using adhesive paste and/or an adhesive film. Alternatively, the flex circuit and printhead die may be attached to the cartridge using press fitting, clamping, soldering, mechanical fastening (e.g. screws, bolts, and rivets) or other attachment methods as would be readily apparent to one skilled in the art. The plurality of cantilever leads are bent such that the flex circuit is not subjected to substantial stresses resultant from the bending of the plurality of cantilever leads. As aforementioned, the plurality of cantilever leads may comprise a first material with a relatively high ductility as compared to the second material of the flex circuit to facilitate the bending of the plurality of cantilever leads without substantial resultant stresses.

Preferably, the flex circuit is shrouded with a capping shroud in step 360 to protect the flex circuit. Further, the plurality of cantilever leads are preferably encapsulated with an encapsulant in one of or both steps 350 and 370, to protect the cantilever leads. As would be readily apparent to one skilled in the art, steps 350 and/or 370 may be performed at any one of a number of stages within the manufacturing process. Hence the order shown in FIG. 3 is purely exemplary and is not limiting on the scope of the invention. One advantage of the present invention, is that encapsulant can be readily applied to an interior surface of the at least one cantilever lead in step 350 when the interior surface is exposed prior to bending the leads in step 355 but after the printhead die has been aligned on the cartridge in step 340. Consequently, a uniform and comprehensive application of encapsulant on the at least one cantilever lead can be performed more easily than in conventional methods.

Thus, a method of manufacturing an inkjet cartridge comprising a circuit having at least one bent cantilever lead has been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined the claims appended hereto, and their equivalents.

What is claimed is:

1. A method of manufacturing an inkjet cartridge, comprising the steps of:
   providing a flexible circuit having at least one cantilever lead;
   providing a printhead die having at least one bonding region;
   bonding said at least one cantilever lead to said at least one bonding region; and, after bonding said at least one cantilever lead to said at least one bonding region,
   bending said at least one bonded cantilever lead; and
   shrouding the flexible circuit with a capping shroud.

2. The method of claim 1, wherein the step of bending said at least one cantilever lead is performed by conforming said circuit to a portion of a cartridge.

3. The method of claim 1, wherein the at least one cantilever lead comprises a first material having a greater ductility than a second material of the circuit.

4. The method of claim 3, wherein the first material comprises copper.

5. The method of claim 3, wherein the second material comprises a nonconductive flexible film.

6. The method of claim 1, further comprising a step of: encapsulating said at least one cantilever lead.

7. The method of claim 1, wherein the step of bonding said at least one cantilever lead to said at least one bonding region comprises the steps of:
   aligning said flexible circuit on the same plane with said printhead die; and
   attaching said at least one cantilever lead to said at least one bonding region,
   wherein said flexible circuit and said printhead die are held in place during attachment within a bonding tool.

8. The method of claim 1, further comprising a step of: preventing the at least one bent cantilever lead from contacting the printhead die in a non-bonding region.

9. The method of claim 1, wherein the at least one cantilever lead comprises a TAB lead.

10. An electronic printing device, comprising:
    a printhead die;
    a cartridge;
    a flexible circuit positioned adjacent to said cartridge, said flexible circuit having at least one cantilever lead bonded to said die,
    wherein said at least one cantilever lead is bent to said die; and
    a capping shroud Positioned over the flexible circuit, said capping shroud providing a continuous capping surface around the printhead die.

11. The printing device of claim 10, wherein the at least one cantilever lead comprises a first material having a greater ductility than a second material of the circuit.

12. The printing device of claim 11, wherein the first material comprises copper.

13. The printing device of claim 11, wherein the second material comprises a flexible film.

14. The printing device of claim 10, further comprising: an encapsulant dispensed over the at least one cantilever lead.

15. The printing device of claim 10, wherein the printhead die further comprises a hedgerow, said hedgerow preventing the at least one cantilever lead from contacting the surface or corner of the die.

16. The printing device of claim 10, wherein the at least one cantilever lead comprises a TAB lead.

17. The printing device of claim 10, wherein the printing device is an inkjet cartridge.

* * * * *